United States Patent [19]

Bachert

[11] 4,176,332

[45] Nov. 27, 1979

[54] FREQUENCY MULTIPLIER
[75] Inventor: Peter Bachert, Scottsdale, Ariz.
[73] Assignee: Motorola, Inc., Schaumburg, Ill.
[21] Appl. No.: 852,892
[22] Filed: Nov. 18, 1977
[51] Int. Cl.² .................. H01P 1/20; H03B 19/14
[52] U.S. Cl. .................................. 333/218; 328/16;
363/163
[58] Field of Search ..................... 328/15, 16, 20;
307/220 R; 363/158, 159, 163, 166

[56] References Cited
U.S. PATENT DOCUMENTS

| | | | |
|---|---|---|---|
| 3,230,396 | 1/1966 | Boelke | 363/163 X |
| 3,263,154 | 7/1966 | Steele | 363/158 |
| 3,662,294 | 5/1972 | Jacobs et al. | 333/33 |
| 3,921,056 | 11/1975 | Mahoney | 328/16 X |

Primary Examiner—Paul L. Gensler
Attorney, Agent, or Firm—James W. Gillman; Victor Myer

[57] ABSTRACT

A signal at a frequency $f_0$ is coupled through matching circuitry to the input of a parametric frequency multiplier stage. Non-linearities in this stage generate harmonics of the frequency $f_0$, including a desired harmonic $k \times f_0$, where $k = 2, 4, 6, 8...$. Unique output coupling circuitry presents a high load impedance to the parametric multiplier at the frequency $f_0$, thereby enhancing harmonic generation, and transforms the impedance to signals of frequency $k \times f_0$ at the multiplier stage output to a desired value. The output coupling circuit includes two series connected transmission lines which couple between the output of the parametric multiplier stage and the multiplier output. A third transmission line, having an electrical length of one quarter wavelength at frequency $f_0$, is connected as an open circuit shunt stub to the multiplier output, thereby effectively producing a short circuit thereat at $f_0$. The combined electrical length of the series connected transmission lines is also one quarter wavelength at frequency $f_0$ thereby transforming the short at the multiplier output to a high impedance at the output of the parametric multiplier. The desired impedance transformation is accomplished by providing each of the series connected transmission lines with an appropriate characteristics impedance.

13 Claims, 1 Drawing Figure

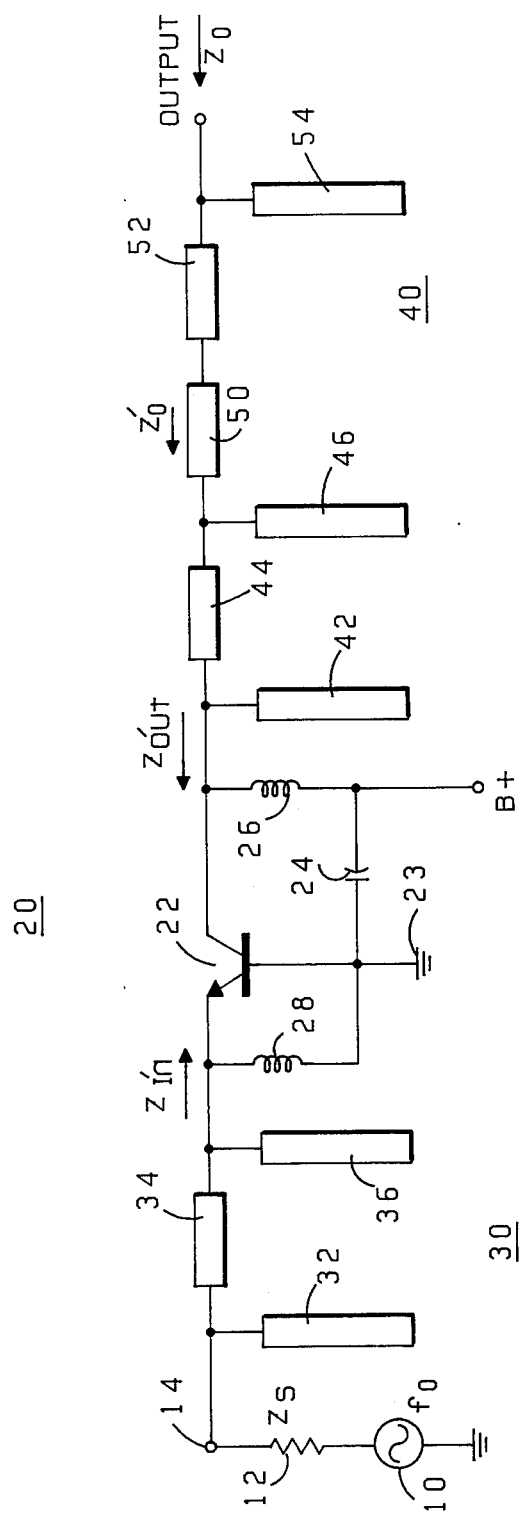

FREQUENCY MULTIPLIER

BACKGROUND OF THE INVENTION

The present invention pertains to the radio communication art and, more particularly, to a radio transmitter frequency multiplier.

The communication art, particularly in the field of radio frequency transmission, has developed numerous means for frequency multiplication. The need for frequency multiplication arises, for example, in radio transmitters wherein a high radio frequency carrier must be generated. Here, it is common to generate a submultiple of the desired signal in a conventional oscillator and follow the oscillator with a multiplier chain which outputs the desired multiple frequency.

One common multiplier design utilizes parametric frequency multiplication. Generally, a bipolar transistor is biased as an active stage with the oscillator signal applied at either its emitter or base. Non-linearities in the transistor due to the exponential voltage/current relationship of its emitter base junction as well as the non-linear base collector depletion capacitance versus applied voltage cause harmonics of the input signal to appear in the collector. Subsequent filtering is used to select the desired harmonic signal.

Such prior art parametric amplifiers suffer two defects. Firstly, they are inefficient. The generation of sufficient amplitude harmonic signals requires that a very large oscillator signal be applied at the stage's input. In addition, such parametric amplifiers are generally not adaptable for wide bandwith operation. This results from the fact that the load generally presented to the collector of the bipolar stage exhibits a widely varying reactive component as a function of frequency.

SUMMARY OF THE INVENTION

It is an object of this invention, therefore, to provide an improved parametric amplifier design capable of high operating efficiency.

It is a further object of the invention to provide the above described improved parametric amplifier which is capable of operating over a wide frequency bandwidth.

Briefly, according to the invention, the improved frequency multiplier circuit receives a signal of frequency $f_0$ and produces a signal of frequency of $k \times f_0$ where $k = 2, 4, 6, 8 \ldots$, and an output impedance $Z_0$. The multiplier includes a frequency harmonic generator, preferably a bipolar parametric amplifier stage, which receives signals at the frequency $f_0$ and produces output signals at the harmonics thereof including a harmonic at $k \times f_0$. The amplitude of the harmonic signals from this stage increase with an increase signal at $f_0$ applied to the stage. The harmonic generating stage exhibits an output impedance $Z_{out}'$. Suitable means couples the signal of frequency $f_0$ to the harmonic generator. Unique loading circuitry couples to the output of the harmonic generator. The design of the load is such that it presents a high impedance to the output of the harmonic generator at the frequency $f_0$ thereby increasing the amplitude of signals at $f_0$ therein. Moreover, the load and circuitry transforms the output impedance $Z_{out}'$ of the harmonic generator to the desired output impedance of the multiplier, namely, $Z_0$.

Preferably, the output loading circuitry includes first and second series coupled transmission lines which couple from the output of the harmonic generator to the overall output of the multiplier circuit. Each of the series coupled transmission lines has a characteristic impedance such that the matching between $Z_{out}'$ to $Z_0$ is accomplished. Moreover, the combined electrical lengths of the two series coupled transmission lines is such that they provide a 180° phase shift to signals of frequency $(2n-1) \times f_0$, where $n = 1, 2, 3 \ldots$ whereby a short at the frequency $f_0$, provided by a third transmission line connected in shunt to the output of the multiplier, is reflected back to the harmonic generator as a very high impedance, thereby containing circulating currents at $f_0$ within the harmonic generating device.

BRIEF DESCRIPTION OF THE DRAWING

The attached drawing is a schematic diagram illustrating preferred construction of a high power wide band frequency doubler. Preferably, the circuit is realized using conventional stripline fabrication techniques.

DETAILED DESCRIPTION OF THE PREFERRED EMBODIMENT OF THE INVENTION

Referring to the drawing, a signal source 10 comprised of a conventional oscillator, produces an output signal of frequency $f_0$. The inherent source impedance of signal source 10 is schematically illustrated by the source resistor 12 labeled $Z_s$. The signal generator 10 is connected through its source resistance 12 to the input terminal 14 of the frequency doubler circuit, indicated generally at 20. Doubler stage 20 is built around an active element, namely, bipolar transistor 22. Transistor 22 has its base connected to ground or reference potential 23, thus forming a common base amplifier. Biasing to the stage is provided from a DC power supply, B+, which is RF bypassed via capacitor 24. An RF choke 26 couples bias to the collector, with the emitter DC return path provided through shunt coupled RF choke 28. Input signals to transistor stage 22 are applied across the base emitter junction which exhibits an input impedance $Z_{in}'$. Thus, matching circuitry 30 is provided which matches the signal source impedance $Z_s$ to the transistor input impedance $Z_{in}'$. Input matching circuitry 30 includes first, second and third transmission lines 32, 34 and 36, respectively, connected in a pi matching circuit. The design of such pi matching networks are well-known in the art. Of particular import in this, the preferred embodiment of the invention, is that the first transmission line 32, is connected as an open circuit stub which is resonant at frequencies $3nf_0$ where $n = 2, 3, \ldots$ and the third transmission line 36, also connected as an open circuit stub, is resonant at frequencies $2nf_0$. Thus, any harmonics generated by the signal source 10 are effectively shorted by the open circuit transmission lines 32, 36 whereby the principle signal reaching the transistor stage 22 is a signal at frequency $f_0$.

Transistor stage 22 operates as a parametric frequency multiplier. That is, non-linearities in the emitter base voltage/current relationship as well as variations in the base-collector depletion capacitance versus base-collector voltage due to applied AC signals cause the generation of harmonics of the input signal $f_0$, which harmonics, along with the fundamental signal appear at the collector of the transistor stage 22. The amplitude of the harmonic signals increases as the amplitude of the signal $f_0$ applied to the stage 22 increases. Thus, it is desirable to maximize a circulating current caused by signal $f_0$ in the transistor stage 22 to thereby increase the efficiency of the overall frequency doubler.

Indicated generally at 40 is a unique output coupling or load circuit. It is the function of this circuit to present a very high impedance to the collector of the transistor stage 22 at the frequency $f_0$ thereby maximizing the circulating currents therein to generate the desired harmonics. Further, the output coupling circuit 40 transforms the output impedance of the transistor stage 22, i.e. $Z_{out}'$, to the desired output impedance of the doubler circuit, i.e. $Z_0$, for signals at the desired harmonic, which in this example is $2 \times f_0$.

The construction and function of the output coupling circuit 40 is as follows. Coupled directly to the collector of transistor 22 is a pi section filter comprised of transmission lines 42, 44, and 46. Transmission lines 42 and 46 are coupled as open circuit stubs, each being series resonant at $4nf_0$, where, as before, $n = 1, 2, 3 \ldots$ Open circuit stubs 42, 46 present a constant load impedance to the transistor stage 22 for signals at the resonant frequency of the stubs. Thus, the operating characteristics of the transistor stage 22 are isolated from varying loads at the harmonic frequencies, thereby maintaining a desired operating characteristic in the transistor and rendering the system operable over a wide bandwidth. U.S. Pat. No. 3,662,294 to Jacobs et al, issued May 9, 1972 and assigned to the same assignee as the instant invention describes in greater detail this so called "load pull" phenomenon.

In addition to providing a fixed load to harmonics at the collector of transistor 22, the pi section filter comprised of transmission lines 42, 44 and 46 also transforms the output impedance $Z_{out}'$ of the transistor stage to a desired output impedance, $Z_0$, of the multiplier.

The impedance $Z_0'$ is transformed to the desired output impedance $Z_0$ by the final portion of the output coupling circuit which is comprised of first and second series connected transmission lines 50 and 52, respectively, and a third shunt output transmission line 54 coupled as an open circuit stub. Series coupled transmission lines 50 and 52 accomplish two functions. Firstly, each transmission line 50, 52 is designed to exhibit a predetermined characteristic impedance whereby the impedance $Z_0'$ is transformed to the desired impedance $Z_0$. In addition, each series coupled transmission line is of predetermined electrical length such that the two in combination provide a 180° phase shift to all signals at frequencies $(2n-1) \times f_0$, where $n = 1, 2, 3 \ldots$ That is, each of the first and second transmission lines is approximately a quarter wave transformer to signals of frequency $2 \times f_0$. The third transmission line 54 is designed to be one half wavelength at $2 \times f_0$, or in other words equivalent to one quarter wavelength at all frequencies $(2n-1) \times f_0$ and, since it is connected as an open circuit stub, reflects a short to the output of the frequency doubler at these frequencies. This short is transformed 180° by the series coupled transmission lines 50, 52 such that the impedance presented to the transistor stage 22 is very high at these frequencies. Thus, for example, for the case of $n = 1$ the transistor 22 sees a very high load impedance for signals of frequencies $f_0$. This high impedance loading causes circulating currents to be contained within the transistor 22 thereby increasing its generation of harmonics, and in particular, generation of the harmonic at frequency $2 \times f_0$.

An additional benefit of designing transmission lines 50, 52 to be one quarter wavelength at the desired output frequency is that the reactive part of $Z_0'$ will remain substantially constant over a wide frequency range. Thus, the instant multiplier circuit does not suffer the bandwidth limitations known to such circuits in the prior art.

In summary, an inventive frequency multiplier has been described which exhibits high efficiency over a wide bandwidth.

While a preferred embodiment of the invention has been described in detail, it should be apparent that many modifications and variations thereto are possible, all of which fall within the true spirit and scope of the invention.

For example, while the preferred embodiment of the invention was constructed in microstripline form it is easily contemplated that an alternate form, such as stripline could be used. Moreover, while the preferred embodiment of the invention illustrates a frequency doubler circuit, it should be understood that the invention finds application for any frequency multiplying requirement wherein signals of frequency $k \times f_0$, where $k = 2, 4, 6, \ldots$ are to be generated from an input signal of frequency $f_0$.

I claim:

1. A frequency multiplier circuit for receiving a signal of frequency $f_0$ and producing a signal of frequency $k_x f_0$, where $k = 2, 4, 6, 8 \ldots$, at a desired output impedance $Z_0$, said multiplier circuit comprising:
    harmonic generating means adapted for receiving said signal of frequency $f_0$ and producing signals at frequency harmonics thereof, including a harmonic signal of frequency $k \times f_0$, the amplitude of said harmonic signals increasing with an increased signal at $f_0$ in said harmonic generating means, said harmonic generating means exhibiting an output impedance $Z_{out}'$;
    coupling means for coupling said signal of frequency $f_0$ to said harmonic generating means;
    output loading means coupled to said harmonic generating means and providing a load circuit thereto, said output loading means comprising:
    (a) first and second series coupled transmission line means for coupling said harmonic generating means produced harmonic signals to the multiplier circuit output, each of said first and second transmission lines having predetermined characteristic impedances for transforming the impedance to signals of frequency $k \times f_0$ at the input thereof to the desired output impedance $Z_0$ of said frequency multiplier, said first and second transmission lines having predetermined electrical lengths to provide a combined phase shift of 180° to signals of frequency $(2n-1) \times f_0$, where $n = 1, 2, 3 \ldots$; and
    (b) third transmission line means having an electrical length of one quarter wavelength at frequencies $(2n-1) \times f_0$, where $n = 1, 2, 3 \ldots$, coupled to the output of said frequency multiplier such that a short at frequency $f_0$ is reflected thereto, whereby the short at frequency $f_0$ at the output of the multiplier circuit is transformed to a high impedance at $f_0$ to the output of said harmonic generator.

2. The frequency multiplier circuit of claim 1 wherein said harmonic generating means comprises a parametric frequency multiplying device.

3. The frequency multiplier circuit of claim 1 wherein said harmonic generating means comprises:
    a semiconductor device having first, second and third terminals, said first terminal receiving said signal of frequency $f_0$, said second terminal coupled to a reference potential and said third terminal for producing said harmonic frequency signals due to non-linearities in said semiconductor device.

4. The frequency multiplier circuit of claim 3 wherein said semiconductor device is a bipolar transistor having its emitter coupled to said first terminal, its base coupled to said second terminal and its collecter coupled to said third terminal and wherein said semiconductor non-linearities include the exponential voltage/current relationship of the emitter-base junction and variations in base-collector depletion capacitance as a function of base-collector voltage.

5. The frequency multiplier circuit of claim 1 wherein the source of said signal of frequency $f_0$ has an output impedance $Z_s$, wherein said harmonic generating means has an input impedance $Z_{in}'$ and wherein said coupling means includes means for matching said source impedance $Z_s$ to said harmonic generating means input impedance $Z_{in}'$.

6. The frequency multiplier circuit of claim 5 wherein said coupling means further comprises input filter means for suppressing the coupling of signals at harmonic frequencies of $f_0$ to the harmonic generating means.

7. The frequency multiplier circuit of claim 4 wherein the source of said signal of frequency $f_0$ has an output impedance $Z_s$, wherein said harmonic generating means has an input impedance $Z_{in}'$ and wherein said coupling means includes means for matching said source impedance $Z_s$ to said harmonic generating means input impedance $Z_{in}'$.

8. The frequency multiplier circuit of claim 7 wherein said coupling means further comprises input filter means for suppressing the coupling of signals at harmonic frequencies of $f_0$ from the source of said signal of frequency $f_0$ to the harmonic generating means.

9. The frequency multiplier circuit of claim 1, 4 or 6 wherein the output loading means further comprises impedance matching means for matching the output impedance $Z_{out}'$ of said harmonic generating means to the input of said series coupled first and second transmission lines.

10. A frequency doubler circuit for receiving an input signal of frequency $f_0$ and producing an output signal of frequency $2 \times f_0$, and having an output impedance $Z_0$, comprising:
a parametric frequency multiplier means having an input for receiving said signal at frequency $f_0$ and an output for producing said signal $f_0$ and harmonics thereof including a signal of frequency $2 \times f_0$, said parametric multiplier having an output impedance $Z_{out}'$, and
coupling means coupled between the output of said parametric frequency multiplier and the output of said frequency doubler, said coupler means comprising:
(a) first and second series coupled transmission line means for coupling said parametric frequency multiplier means produced harmonic signals to the frequency doubler circuit output, each of said first and second transmission lines having predetermined characteristic impedances for transforming the impedance to signals of frequency $2 \times f_0$ at the input thereof to the desired output impedance $Z_0$, of said frequency doubler, said first and second transmission lines having predetermined electrical lengths to provide a combined phase shift of 180° to signals of frequency $(2n-1) \times f_0$, where $n = 1, 2, 3 \ldots$; and
(b) third transmission line means having an electrical length of one quarter wavelength at frequencies $(2n-1) \times f_0$, where $n = 1, 2, 3 \ldots$, coupled to the output of said frequency doubler such that a short at frequency $f_0$ is reflected thereto;
whereby the short at frequency $f_0$ at the output of the doubler circuit is transformed to a high impedance at $f_0$ to the output of said parametric frequency multiplier.

11. The frequency doubler circuit of claim 10 wherein said parametric frequency multiplier means comprises:
a semiconductor device having first, second and third terminals, said first terminal receiving said signal of frequency $f_0$, said second terminal coupled to a reference potential and said third terminal for producing said harmonic frequency signals due to non-linearities in said semiconductor device.

12. The frequency doubler circuit of claim 11 wherein said semiconductor device is a bipolar transistor having its emitter coupled to said first terminal, its base coupled to said second terminal and its collector coupled to said third terminal and wherein said semiconductor non-linearities include the exponential voltage/current relationship of the emitter-base junction and variation in the base-collector depletion capacitance as a function of base-collector voltage.

13. The frequency doubler circuit of claim 10 or 12 wherein the coupling means further comprises impedance matching means for matching the output impedance $Z_{out}'$ of said parametric frequency multiplier to the input of said series coupled first and second transmission lines.

* * * * *